United States Patent [19]

Berkcan

[11] Patent Number: 5,642,041
[45] Date of Patent: *Jun. 24, 1997

[54] ALTERNATING CURRENT SENSOR EMPLOYING PARALLEL PLATES AND HAVING HIGH DYNAMIC RANGE AND ACCURACY

[75] Inventor: Ertugrul Berkcan, Schenectady, N.Y.

[73] Assignee: General Electric Company, Schenectady, N.Y.

[*] Notice: The term of this patent shall not extend beyond the expiration date of Pat. No. 5,587,651.

[21] Appl. No.: 342,510

[22] Filed: Nov. 21, 1994

[51] Int. Cl.$^6$ .............................. G01R 33/00; G01R 1/20
[52] U.S. Cl. ........................ 324/127; 324/117 R
[58] Field of Search ........................ 324/158.1, 117 R, 324/126, 127, 117 H; 336/181, 182, 223; 338/49, 333

[56] References Cited

U.S. PATENT DOCUMENTS

| | | | |
|---|---|---|---|
| 4,182,982 | 1/1980 | Wolf et al. | 324/127 |
| 4,492,919 | 1/1985 | Milkovic | 324/127 |
| 4,580,095 | 4/1986 | DeVries | 324/126 |
| 4,894,610 | 1/1990 | Friedl | 324/117 R |
| 5,066,904 | 11/1991 | Bullock | 324/126 |
| 5,107,204 | 4/1992 | Bullock et al. | 324/127 |

OTHER PUBLICATIONS

"Split–Conductor Current Sensors with Electronic Load Termination", Miran Milkovic, IEEE Transactions on Instrumentation and Measurement, vol. 41, No. 4, Aug. 1992, pp. 540–547.

"Electrical Measurements" by Frank A. Laws, Massachuseets Institute of Technology, 1938, pp. 72–75.

Primary Examiner—Vinh P. Nguyen
Attorney, Agent, or Firm—Marvin Snyder

[57] ABSTRACT

An alternating current sensor includes a first conductor plate, a second conductor plate positioned in spaced relationship relative to the first conductor plate and facing the first conductor plate, and a third conductor plate for electrically interconnecting the first and second conductor plates to form a connected conductive path along the first and second conductor plates. The first and second conductor plates are shaped to form respective magnetic field constituents around each of the first and second conductor plates during current flow along the conductive path. A sensor, made up of one or more air-core coils, is provided for sensing changes in magnetic flux within a predetermined region, such as in a passage between the first and second conductor plates and/or near respective outer surfaces of the first and second conductor plates.

9 Claims, 5 Drawing Sheets

ALTERNATING CURRENT SENSOR EMPLOYING PARALLEL PLATES AND HAVING HIGH DYNAMIC RANGE AND ACCURACY

RELATED APPLICATIONS

This application is related to U.S. patent application Ser. No. 08/342,505, entitled "Alternating Current Sensor Based On Parallel-Plate Geometry And Having a Shunt For Self Powering" by E. Berkcan et al. (now U.S. Pat. No. 5,587, 652); U.S. patent application Ser. No. 08/342,503 entitled "Alternating Current Sensor Based On Parallel-Plate Geometry And Having A Conductor For Providing Separate Self-Powering" by E. Berkcan et al. (now U.S. Pat. No. 5,587, 651); U.S. patent application Ser. No. 08/342,504 entitled "Alternating Current Sensor Based on Concentric-Pipe Geometry And Having A Transformer For Providing Separate Self-powering" by E. Berkcan et al. (now U.S. Pat. No. 5,541,503). Each of the above-listed applications is filed concurrently with the present application, assigned to the assignee of the present invention and herein incorporated by reference.

BACKGROUND OF THE INVENTION

This invention relates to current sensors and, more particularly, to an alternating current sensor employing parallel plates.

Current sensors, such as U.S. Pat. No, 5,066,904, entitled "Coaxial Current Sensors," by Bullock, issued Nov. 19, 1991, assigned to the assignee of the present invention and herein incorporated by reference, are known in the art. These sensors, although useful, suffer from some disadvantages including the need for a current shunt to help reduce the expense of the current sensor by reducing the number of ampere-turns in the active part of the current sensor while also obtaining an accurate measurement of the current. However, even the use of an accurate current shunt typically introduces some expense due to the current sensor materials, such as low temperature coefficient materials, the large number of coil "turns" in the sensing and feedback coils of the current shunt, as well as the manufacturing care required to fabricate the current sensor. Thus, a need exists for a current sensor that overcomes these problems. Moreover, high-power circuit breaker applications generally require current sensors having a high dynamic range and accuracy while maintaining a relatively low cost and size.

SUMMARY OF THE INVENTION

Generally speaking, the present invention fulfills the foregoing needs by providing an alternating current sensor that comprises a first conductor plate, a second conductor plate positioned in spaced relationship relative to the first conductor plate and substantially facing the first conductor plate, and a third conductor plate for electrically interconnecting the first and second conductor plates to form a connected conductive path along the first and second conductor plates. The first and second conductor plates are shaped to form respective magnetic field constituents substantially around each of the first and second conductor plates during current flow along the conductive path. Sensing means, such as one or more air-core coils, is provided for sensing changes in magnetic flux within a predetermined region, such as in a passage between the first and second conductor plates and/or near respective outer surfaces of the first and second conductor plates.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like numbers represent like parts throughout the drawings, and in which:

DETAILED DESCRIPTION OF THE INVENTION

The present invention advantageously provides an improved alternating current sensor suitable for applications that demand high accuracy and high dynamic range while at the same time providing a current sensor having low-power consumption and small size characteristics.

Figure 1A:
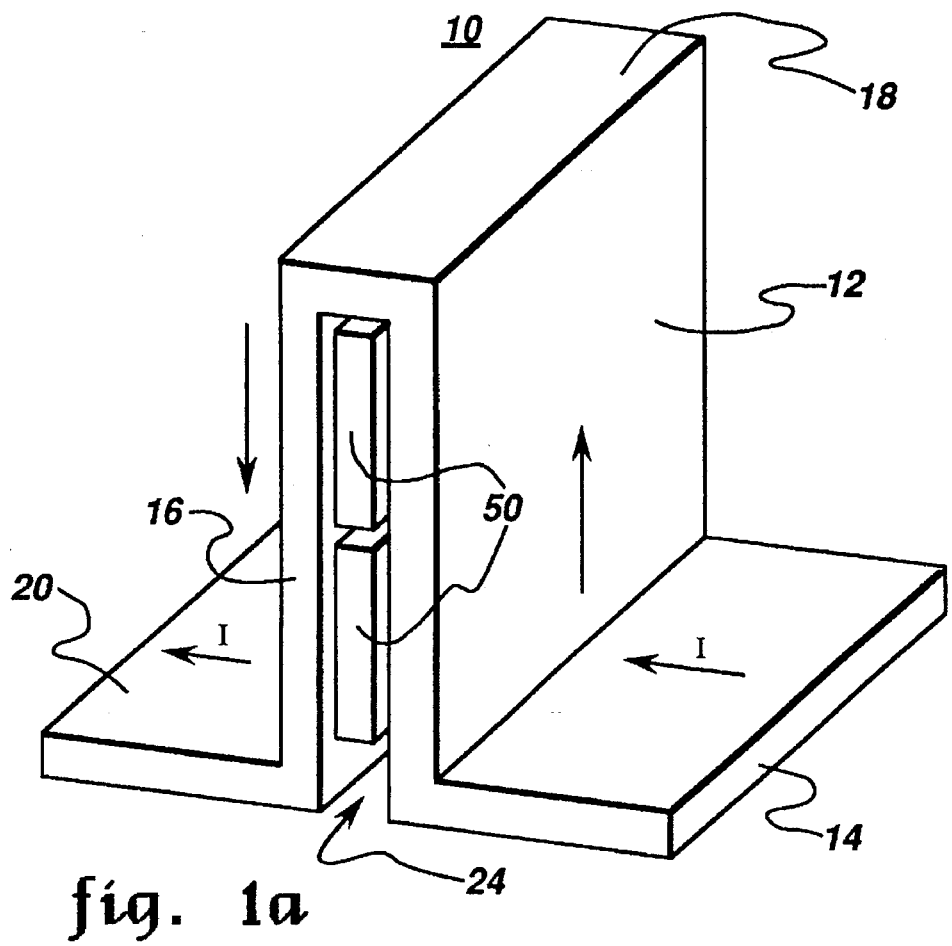
FIG. 1A shows a perspective view of an exemplary embodiment of a current sensor employing parallel-plates in accordance with the present invention.
Figure 1B:
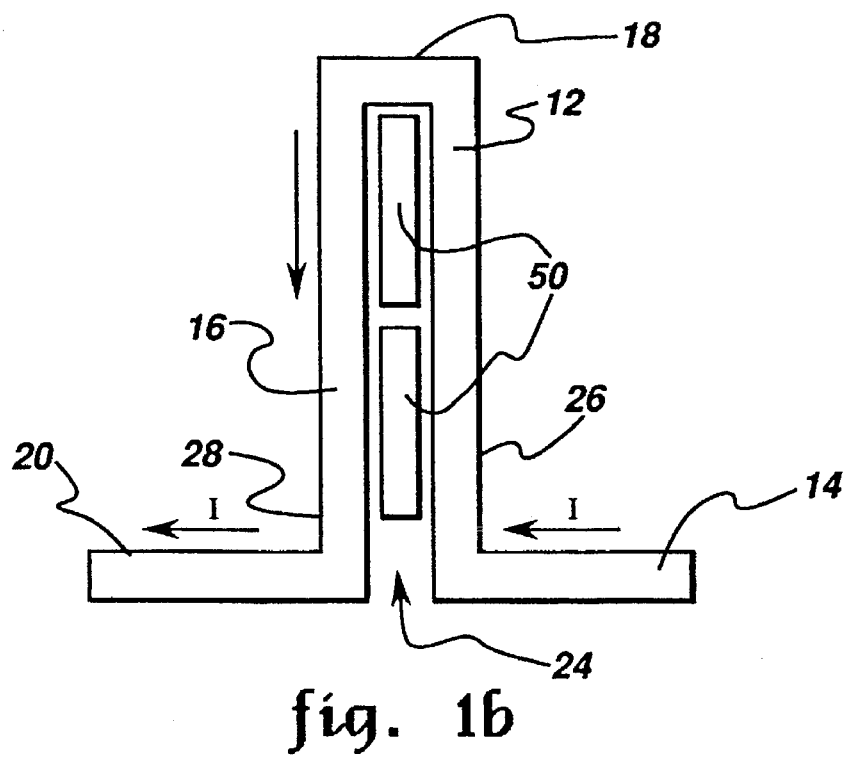
FIG. 1B shows a side view of the current sensor shown in FIG. 1A.

As shown in FIGS. 1A and 1B, a current sensor 10 comprises a first conductor plate 12 that receives current (I) at a suitable input terminal 14. Current I represents the current to be measured by current sensor 10. A second conductor plate 16 is positioned in spaced relationship relative to first conductor plate 12 so as to substantially face conductor plate 12. A third conductor plate 18 is employed for electrically interconnecting conductor plates 12 and 16 to form a connected conductive path along conductor plates 12 and 16. A suitable terminal output 20 can be readily provided for supplying the current flowing therethrough. Terminals 14 and 20 can be conveniently employed for connecting current sensor 10 in series with a predetermined current source (not shown). By way of example, the three conductor plates may be constructed of a suitable conductive material such as copper or a suitable metal alloy. Preferably, the conductive material can be readily cast or extruded to form an integral structure such as a U-shaped structure. Alternatively, the three conductor plates may instead comprise individual conductor plates electromechanically connected to one another using suitable joints, or bolts and the like. In addition, lower ampere-rated current sensors may employ a suitably stamped sheet metal construction. The integral structure is preferred since such construction conveniently avoids heat dissipation at the joints.

Figure 2:
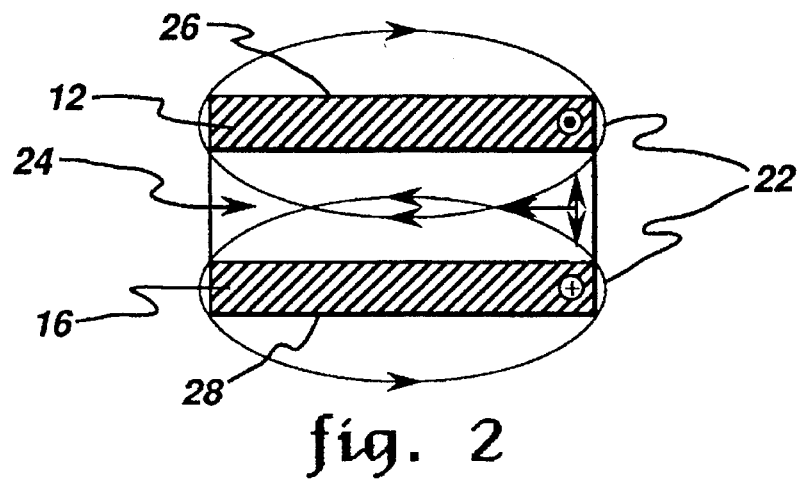
FIG. 2 shows a cross sectional view of the parallel plates employed in the current sensor of FIG. 1, including a conceptual distribution of magnetic field constituents.

As shown in FIGS. 1A and 1B, the first and second conductor plates are preferably positioned substantially parallel relative to one another. Further, the first and second conductor plates are shaped to form respective magnetic field constituents substantially around the first and second conductor plates during current flow along the conductive path. A conceptual distribution of the magnetic field constituents is represented in FIG. 2 by respective ellipses 22 surrounding the respective cross-sections of conductor plates 12 and 16. As shown in FIG. 2, current is shown as flowing into plate 16 and out of plate 14. It will be appreciated that such current flow can be readily reversed so long as each respective current flow in conductor plates 12 and 16 is in mutually opposite directions. For example, in FIG. 1, the role of terminals 14 and 20 could be readily reversed, i.e., terminal 20 could function as the input terminal and terminal 14 could function as the output terminal. In this case, current I would flow in a direction opposite to the arrows shown in FIG. 1, however, the advantages of the present invention remain equally effective so long as each respective current flow in plates 12 and 16 is in mutually opposite directions with respect to one another.

As shown in FIGS. 1 and 2, a passage 24 is defined between the first and second conductor plates. It will be appreciated by those skilled in the art that the respective magnetic field constituents produce a combined magnetic field, in passage 24, that has a generally uniform direction that is substantially parallel to the first and second conductor plates. As shown in FIG. 2, the direction for the combined magnetic field in passage 24 is represented by the horizontal single-headed arrow whereas the vertical twin-headed arrow that is perpendicular to the single headed arrow represents lack of any substantial magnetic field perpendicular to the first and second conductor plates. FIG. 1 further shows sensing means, such as sensor coils 50, for sensing or detecting changes in magnetic flux within a predetermined region. In FIG. 1, the predetermined region is situated in passage 24. It will be appreciated that the predetermined region need not be limited to passage 24, since, as shown in FIG. 2, magnetic field constituents 22 are also formed or distributed near respective outer surfaces 26 and 28 of parallel plates 12 and 16. As will be explained shortly hereafter, this field distribution can be conveniently exploited for improving the dynamic range and accuracy of the current sensor. It will be understood that FIG. 1 shows two sensor coils 50 in passage 24 only by way of example and not by way of limitation, since even a single sensor coil could be effectively employed for detecting changes in magnetic flux within the predetermined region.

Figure 3A:
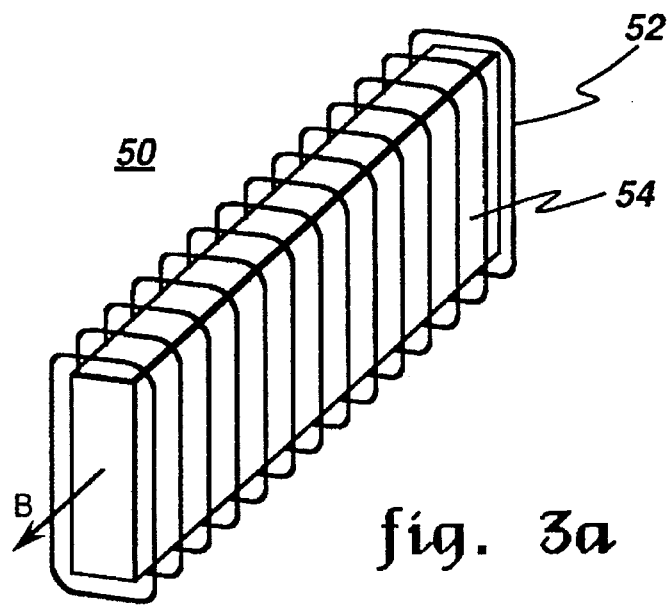
FIG. 3A shows a perspective view of one exemplary sensor coil in accordance with the present invention.
Figure 3B:
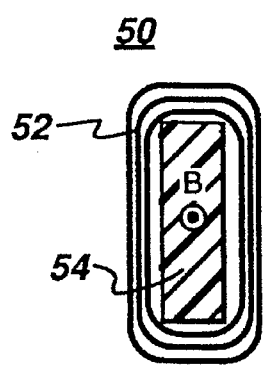
FIGS. 3B and 3C show, respectively, a side view and an elevation view of the sensor coil shown in FIG. 3A.
Figure 3C:
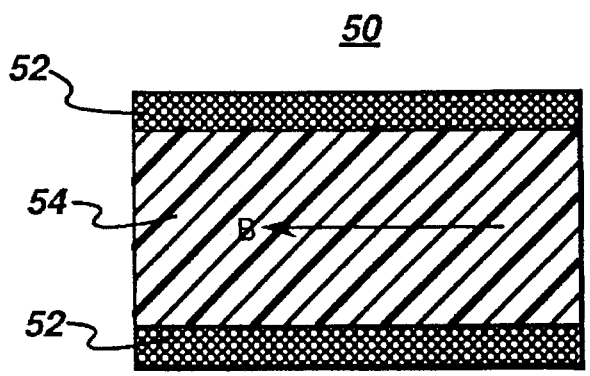

FIGS. 3A–3C show further details for an exemplary sensor coil 50 which can be conveniently employed in a current sensor in accordance with the present invention. Preferably sensor coil 50 comprises an air-core coil made up of a winding 52 wrapped around a suitable core 54 or bobbin having a substantially planar and generally rectangular wall being sufficiently thin to fit in passage 24 (FIGS. 1 and 2). By way of example, the winding can be made of a suitable conductive material such as copper, or aluminum and the like. In the case of an air-coil, core 54 is made of a suitable nonmagnetic material such as plastic, which is molded or extruded to give the desired shape to core or bobbin 54. Although the present invention is not limited to air-core sensor coils, such sensor coils are preferred since their use conveniently avoids many of the drawbacks associated with a magnetic core material, such as magnetic saturation and temperature effects. Thus, this feature of the invention advantageously avoids undesirable magnetic core effects which, if left uncorrected, would detrimentally compromise the accuracy of the current sensor. To avoid any undesirable electrostatic coupling, such as capacitive coupling between the sensor coil and the three conductor plates, an electrostatic shield (such as schematically represented in FIG. 3 of U.S. Pat. No. 5,066,904 by Bullock, assigned to the assignee of the present invention and herein incorporated by reference) can be conveniently employed to substantially enclose the sensor coil. Such a shield is well known in the art as a Faraday shield and may take many forms, such as a conductive or metallic coating on the outer surfaces of the sensor coil, or a separate thin metal enclosure. It will be appreciated that in each case, the shield is electrically insulated from the sensor coil to avoid the possibility of electrical shorts therebetween.

Figure 4:
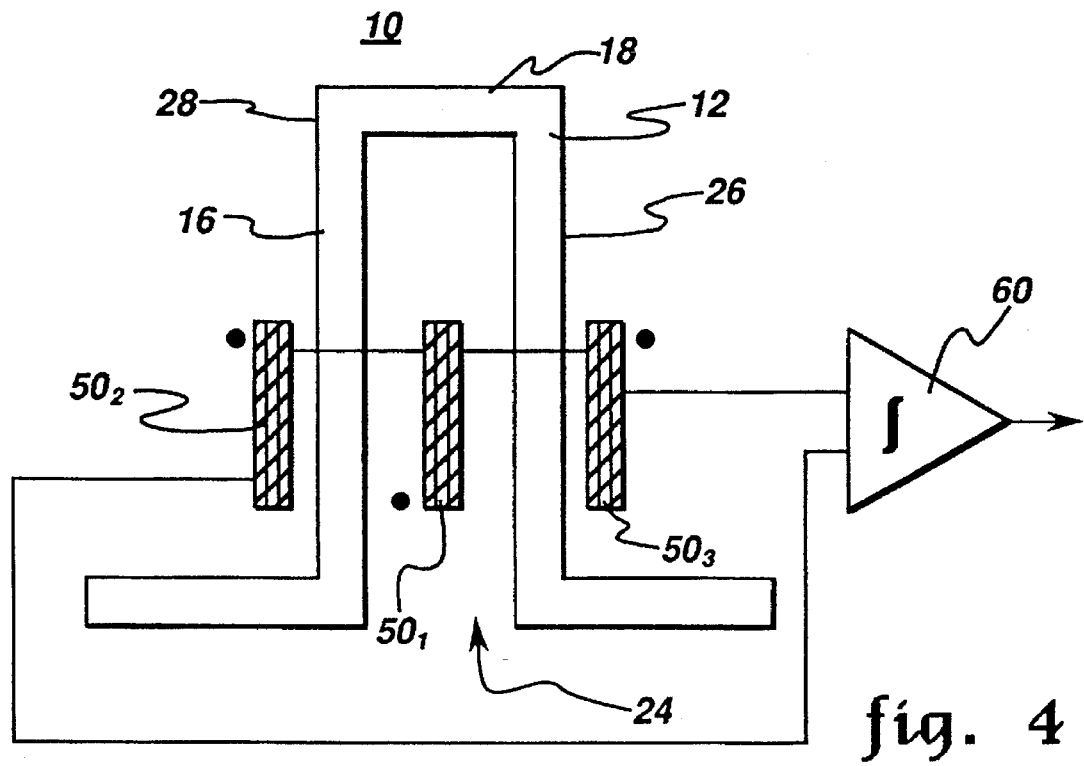
FIG. 4 shows a schematic view of serially coupled sensor coils in accordance with an exemplary mutual induction detection scheme suitable for the current sensor in accordance with the present invention.

FIG. 4 shows a current sensor 10 which employs a mutual induction detection scheme. As shown in FIG. 4, at least one sensor, such as sensor coil $50_1$, is situated in passage 24 between conductor plates 12 and 16. Additional sensors, such as sensor coils $50_2$ and $50_3$, are respectively positioned near respective outer surfaces 26 and 28 of conductor plates 12 and 16. Each of sensor coils $50_1$–$50_3$ is electrically coupled in series to one another so as to increase the overall dynamic range or sensitivity of the current sensor. Further, as represented by the solid dots near each respective sensor coil, any two successive sensor coils have respective windings designed to have an opposite polarity with respect to one another. For example, successive sensor coils $50_1$ and $50_3$ have respective windings designed to have an opposite polarity with respect to one another. Similarly, successive sensor coils $50_1$ and $50_2$ have respective windings designed to have an opposite polarity with respect to one another. As used herein the expression "any two successive sensor coils" refers to sensor coils arranged so that one of the successive sensor coils is situated in passage 24 and the other one is situated near one of the respective outer surfaces 26 and 28 of conductor plates 12 and 16, respectively. This particular sensor coil configuration is particularly advantageous for avoiding interference due to external magnetic fields as well as for increasing the dynamic range and sensitivity of the current sensor. In particular, the opposite winding polarity of any two successive sensor coils allows for additively combining any magnetic field constituents near the respective outer surfaces of parallel plates 12 and 16 with the magnetic field in passage 24. This is because, as shown in FIG. 2, the magnetic field constituents near the respective outer surfaces of parallel plates 12 and 16 have a respective direction which is opposite to the magnetic field direction in passage 24. In contrast, the opposite winding polarity of any two successive sensor coils allows for subtractively canceling any externally produced magnetic field. This follows since it is highly unlikely for such externally produced magnetic field to substantially change or reverse its direction over the respective regions spanned by any two successive sensor coils. Thus, it will be appreciated that the current sensor in accordance with the present invention can be effectively employed for sensing applications which require multiple current sensors to be in relatively close proximity to one another, such as polyphase applications. This can be done with the present current sensor without having to use costly and bulky magnetic shields or magnetic cores for avoiding electromagnetic interference between such multiple current sensors. A suitable integrating amplifier 60 is coupled to receive the voltage signal output from sensor coils $50_1$–$50_3$ to provide a voltage signal which is proportional to the current to be measured and which provides an accurate current measurement. For example, integrating amplifier 60 may be comprised of an operational amplifier with a feedback capacitor (not shown) such that mathematically the signal at the output is the integral of the input signal.

Figure 5:
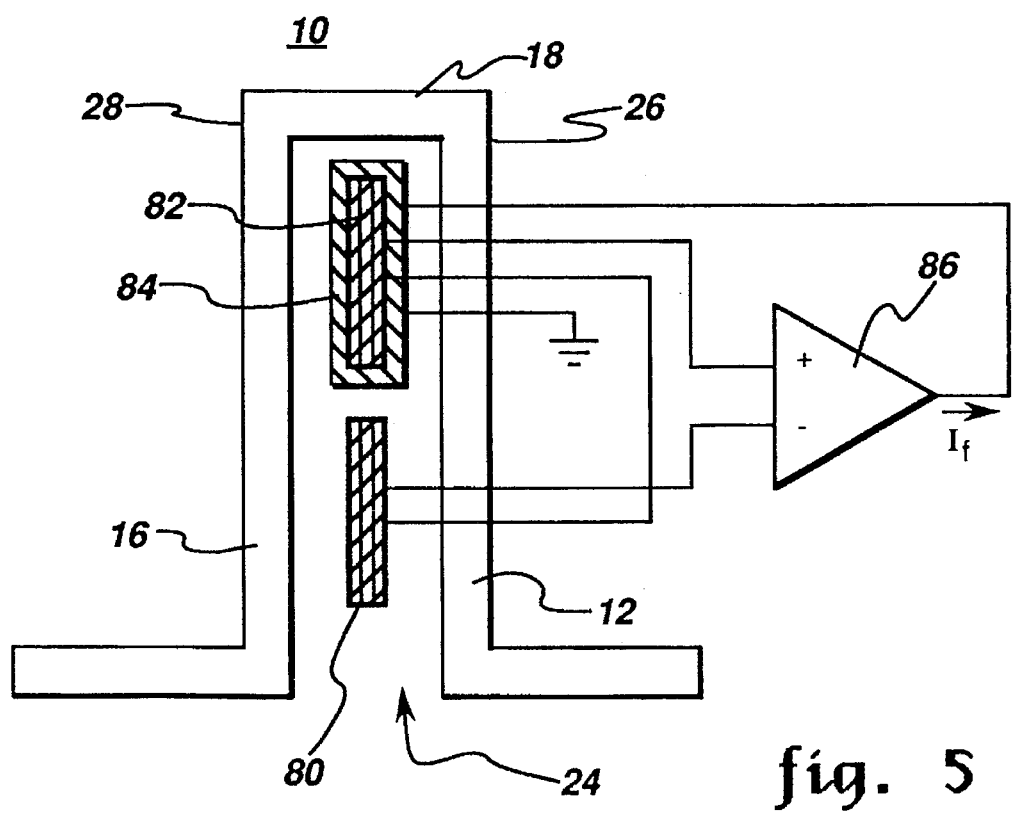
FIG. 5 shows a schematic view of magnetically coupled sensor coils in accordance with an exemplary reduced-flux detection scheme suitable for the current sensor in accordance with the present invention.

FIG. 5 shows a current sensor 10 which employs a reduced flux detection scheme as described in U.S. application Ser. No. 08/085,789, entitled "Reduced Time Rate of Change Magnetic Flux Current Sensor" by E. Berkcan (now U.S. Pat. No. 5,459,395), assigned to the assignee of the present invention and herein incorporated by reference. As shown in FIG. 5, the sensing means comprises a reference coil 80, a sense coil 82 and a feedback coil 84 magnetically coupled to one another within a predetermined region. In FIG. 5, the predetermined region is in passage 24 between conductor plates 12 and 16. Again, the predetermined region need not be limited to passage 24, since, as previously suggested, the predetermined region could also be near the respective outer surfaces 26 and 28 of the first and second conductor plates. A feedback generating circuit, such as an operational amplifier 86 or similar instrumentation amplifier, is responsive to the difference of respective AC signals being induced in reference coil 80 and in sense coil 82 for generating a feedback signal, such as current $I_f$, which is supplied to feedback coil 84 in order to predeterminedly reduce magnetic flux within the predetermined region. The feedback current $I_f$ in feedback coil 84 is proportional to the original or primary current I and provides an accurate current measurement.

Figure 6:
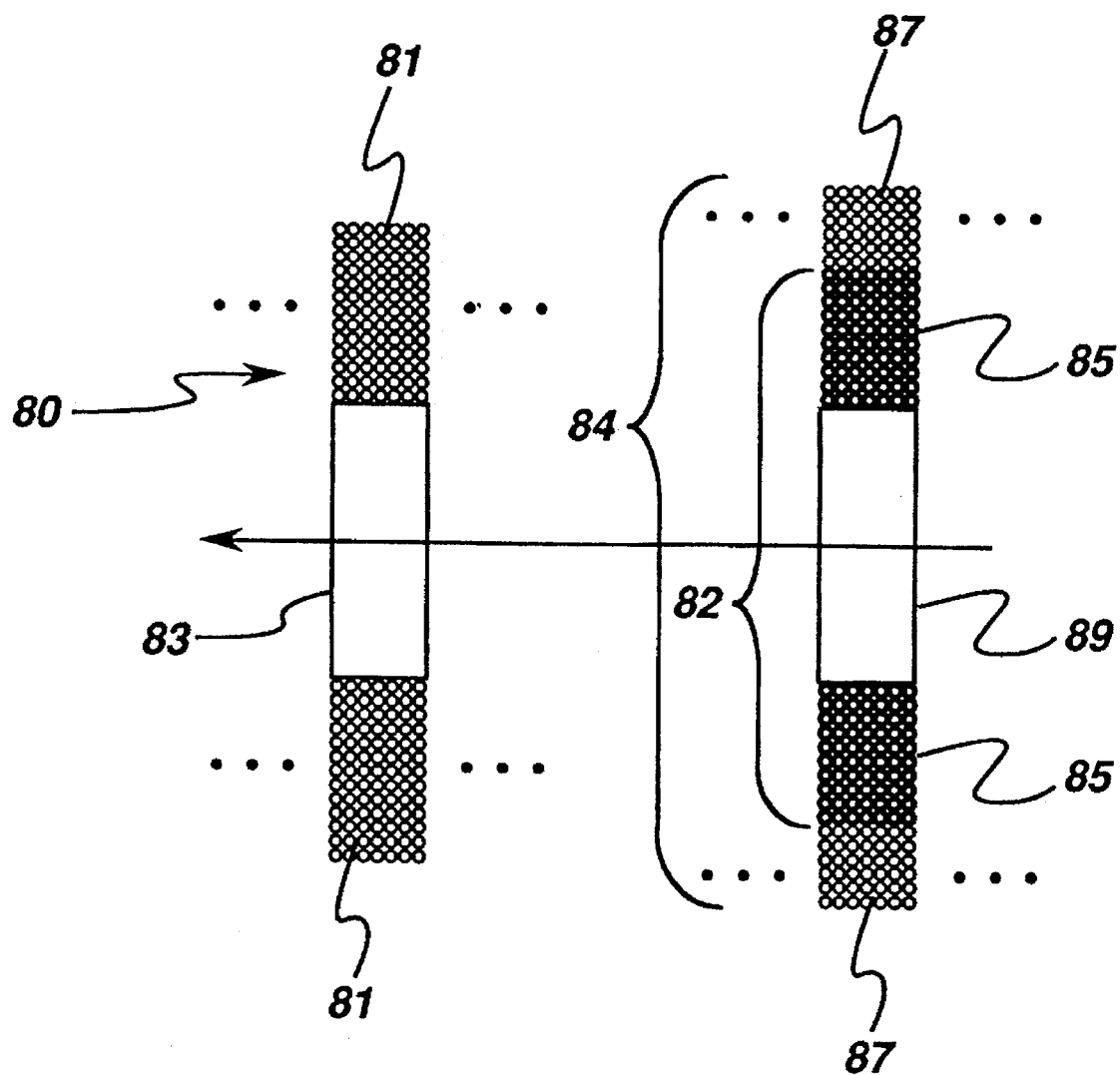
FIG. 6 shows further details about the sensor coils shown in FIG. 5.

FIG. 6 shows an exemplary configuration for the respective coils used in the reduced flux detection technique described in the context of FIG. 5. For example, reference coil 80 is shown to have a respective winding 81 wrapped around a suitable core 83 that can be readily designed as discussed in the context of FIG. 3. Sense coil 82 and feedback coil 84 are shown as having respective windings 85 and 87 suitably wrapped around a common core 89. Although sense coil 82 and feedback coil 84 are shown as sensing changes in magnetic flux over an area substantially in common or incorporated within the cross-sectional area of common core 89, it will be appreciated that the sense coil 82 and feedback coil 84 need not sense changes in magnetic flux over any such common area or incorporated within the cross-sectional area of common core 89. However, it may be desirable for sense coil 82 to have a cross-sectional area substantially overlapping with the cross-sectional area of feedback coil 84. Although the cross-sectional areas of the sensor coils are oriented substantially perpendicular to the direction of the magnetic field, it will now be appreciated that, either in the case of the mutual induction detection technique discussed in the context of FIG. 4 or the reduced flux detection technique discussed in the context of FIG. 5, the cross-sectional area of the sensor coils may be oriented at a predetermined angle with respect to the magnetic field other than substantially perpendicular so long as this orientation or predetermined angle is taken into account with regard to sensing and offsetting the changes in magnetic flux.

Figure 7A:
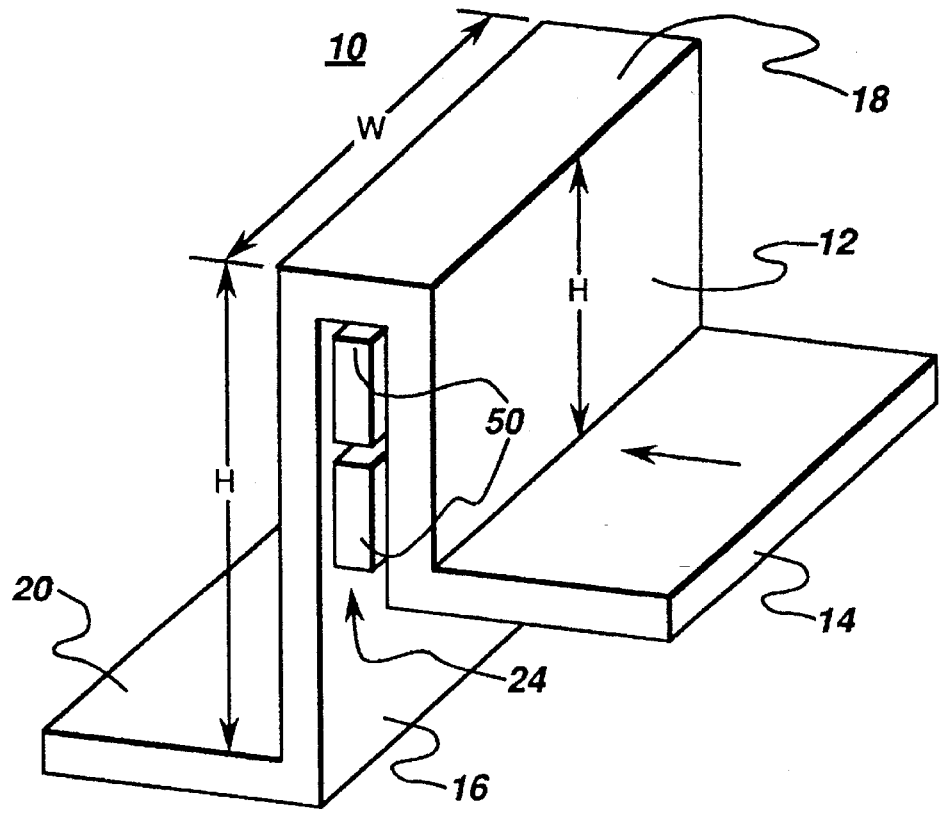
FIG. 7A shows a perspective view of another exemplary embodiment of a current sensor employing parallel-plates in accordance with the present invention.
Figure 7B:
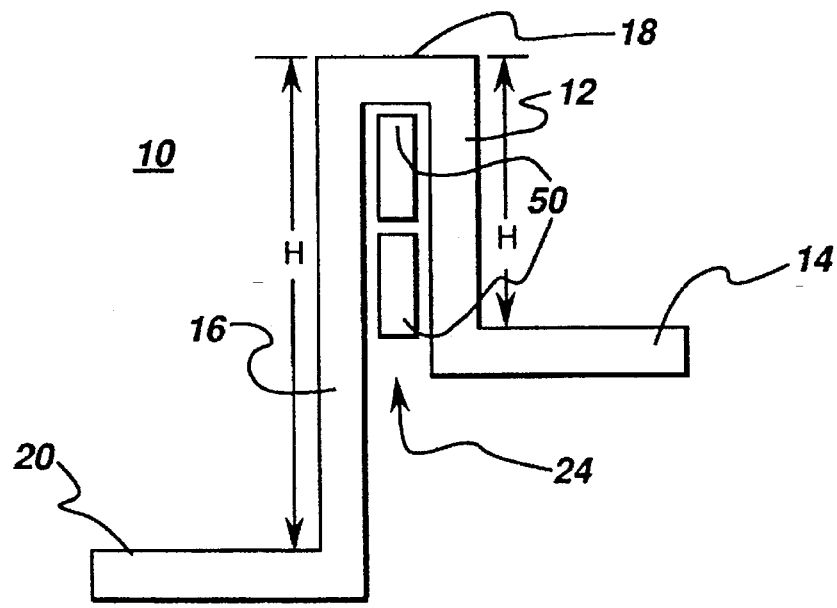
FIG. 7B shows a side view of the current sensor shown in FIG. 7A.

FIGS. 7A and 7B, together with FIGS. 1A and 1B, show that the first and second conductor plates each comprises respective generally rectangular surface areas, which in the case of FIG. 1, substantially correspond to one another. However, as shown in FIG. 7, the respective rectangular surface area of a given one of the first and second conductor plates can have at least one dimension, such as height or width, which has a different magnitude relative to the corresponding dimension of the other one of the first and second conductor plates. By way of example, in FIG. 7, conductor plate 16 has a respective height dimension with a larger magnitude than the height dimension of conductor plate 12. Thus the effectiveness of the current sensor in accordance with the present invention is not limited due to geometrical symmetry between the two conductor plates.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An alternating current sensor comprising:

a first continuous conductor plate;

a second continuous conductor plate positioned in spaced relationship relative to said first conductor plate and substantially facing said first conductor plate such that said first and second conductor plates are substantially parallel to one another;

a third conductor plate for electrically interconnecting said first and second conductor plates to form a connected conductive path along said first and second conductor plates;

said first and second conductor plates shaped to form respective magnetic field constituents substantially uniformly around each of said first and second conductor plates during current flow along the conductive path such that said respective magnetic field constituents produce a combined magnetic field in a passage between said first and second conductor plates, said combined magnetic field having a substantially uniform direction parallel to said first and second conductor plates; and sensing means for sensing changes in magnetic flux resulting from changes in said respective magnetic field constituents, said sensing means comprising at least one sensor adapted to be received in said passage between said first and second conductor plates.

2. The current sensor of claim 1 wherein said sensing means further comprises additional sensors respectively positioned near respective outer surfaces of said first and second conductor plates.

3. The current sensor of claim 2 wherein said at lease one sensor and said additional sensors are coupled in series to one another.

4. The current sensor of claim 3 wherein any two successive sensors of said at least one sensor and said additional sensors have respective coils adapted to have an opposite polarity with respect to one another.

5. The current sensor of claim 2 wherein said at least one sensor and said additional sensors comprises respective air-core coils.

6. The current sensor of claim 1 wherein said at least one sensor comprises a reference coil, a sense coil, and a feedback coil magnetically coupled to each other; and a feedback generating circuit responsive to the difference of respective AC signals in said reference coil and in said sense coil for supplying a feedback signal to said feedback coil, said feedback signal being effective for predeterminedly reducing magnetic flux resulting from said respective magnetic field constituents.

7. The current sensor of claim 6 wherein the sensing means is in the passage between said first and second conductor plates.

8. The current sensor of claim 7 wherein the sensing means is near respective outer surfaces of said first and second conductor plates.

9. The current sensor of claim 1 wherein said first and second conductor plates each comprises a predetermined rectangular surface area and wherein the rectangular surface area of one of said first and second conductor plates has at least one dimension having a different magnitude relative to the magnitude of the corresponding dimension of the other one of said first and second conductor plates.

\* \* \* \* \*